(12) United States Patent
Lowe et al.

(10) Patent No.: US 11,735,672 B2
(45) Date of Patent: Aug. 22, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: Aaron Michael Lowe, Meridian, ID (US); Zhuo Chen, Boise, ID (US); Marko Milojevic, Boise, ID (US); Timothy A. Quick, Boise, ID (US); Richard J. Hill, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 17/216,269

(22) Filed: Mar. 29, 2021

(65) Prior Publication Data
US 2022/0310637 A1 Sep. 29, 2022

(51) Int. Cl.
*H01L 29/786* (2006.01)
*H01L 27/13* (2006.01)
*H01L 27/12* (2006.01)
*H10B 53/20* (2023.01)
*H10B 12/00* (2023.01)

(52) U.S. Cl.
CPC .... *H01L 29/78642* (2013.01); *H01L 27/1203* (2013.01); *H01L 27/13* (2013.01); *H10B 12/05* (2023.02); *H10B 12/31* (2023.02); *H10B 53/20* (2023.02)

(58) Field of Classification Search
None
See application file for complete search history.

(56) References Cited

U.S. PATENT DOCUMENTS

| | | | | |
|---|---|---|---|---|
| 4,864,464 A | * | 9/1989 | Gonzalez | H01L 27/10805 257/532 |
| 6,091,120 A | * | 7/2000 | Yeom | H01L 29/6659 257/E21.204 |
| 2002/0160593 A1 | * | 10/2002 | Dokumaci | H01L 21/28176 257/E21.345 |
| 2009/0159964 A1 | * | 6/2009 | Lee | H01L 29/66666 257/E21.409 |
| 2010/0181624 A1 | * | 7/2010 | Takahashi | H01L 21/28097 257/E29.255 |
| 2014/0231798 A1 | * | 8/2014 | Ono | H05B 33/26 257/43 |
| 2016/0204218 A1 | * | 7/2016 | Grass | H01L 29/7848 257/288 |
| 2018/0374855 A1 | * | 12/2018 | Pandey | H01L 29/7827 |

* cited by examiner

*Primary Examiner* — Mohammad M Hoque
*Assistant Examiner* — Kevin Quinto
(74) *Attorney, Agent, or Firm* — Wells St. John P.S.

(57) ABSTRACT

Some embodiments include an integrated transistor having an active region comprising semiconductor material. A conductive gating structure is adjacent to the active region. The conductive gating structure includes an inner region proximate the active region and includes an outer region distal from the active region. The inner region includes a first material containing titanium and nitrogen, and the outer region includes a metal-containing second material. The second material has a higher conductivity than the first material. Some embodiments include integrated assemblies. Some embodiments include methods of forming integrated assemblies.

11 Claims, 10 Drawing Sheets

INTEGRATED ASSEMBLIES AND METHODS OF FORMING INTEGRATED ASSEMBLIES

TECHNICAL FIELD

Integrated assemblies (e.g., integrated memory). Methods of forming integrated assemblies.

BACKGROUND

Transistors are utilized in a variety of semiconductor devices. Field effect transistors (FETs) have active regions which may include a channel region between a pair of source/drain regions. The FETs may include one or more gates configured to electrically connect the source/drain regions to one another through the channel region.

Vertical FETs (VFETs) have active regions that are generally perpendicular to a primary surface of a substrate on which the transistors are formed.

The transistors may be incorporated into memory arrays, and may be utilized as access devices for memory cells of the memory arrays.

It is desired to develop new methods for forming integrated transistors and integrated memory. It is also desired to develop new transistor configurations, and new assemblies (e.g., memory assemblies) utilizing the new transistor configurations.

Dynamic random-access memory (DRAM) may utilize memory cells which individually comprise an access transistor in combination with a capacitor.

Ferroelectric random-access memory (FeRAM) may be configured similarly to DRAM, except that the FeRAM utilizes ferroelectric capacitors instead of the non-ferroelectric capacitors of conventional DRAM. The ferroelectric capacitors may be understood to be capacitors which utilize ferroelectric insulative material between conductive storage nodes within the capacitor configurations, whereas the non-ferroelectric capacitors may be understood to be capacitors which utilize only non-ferroelectric insulative material between conductive storage nodes within the capacitor configurations.

It would be desirable to develop improved memory architecture, and improved methods of forming memory architecture.

DETAILED DESCRIPTION OF THE ILLUSTRATED EMBODIMENTS

Some embodiments include methods of forming transistors in which template material is utilized for patterning highly-conductive metal-containing material. The template material may, for example, comprise, consist essentially of, or consist of titanium nitride. The titanium nitride may be represented as TiN, where the chemical formula indicates primary constituents rather than a specific stoichiometry. The term "highly-conductive" means more conductive than the template material, and in some embodiments means more conductive than TiN. The highly conductive metal-containing material may include, for example, one or more of ruthenium (Ru), molybdenum (Mo), copper (Cu), platinum (Pt), Palladium (Pd), tungsten (W), tantalum (Ta), cobalt (Co), rhodium (Rh), nickel (Ni), conductive metal nitride (e.g., TaN; where the chemical formula indicates primary constituents rather than a specific stoichiometry), etc. The patterned highly-conductive metal-containing material may be utilized to form conductive gating structures of the transistors. The transistors may be incorporated into integrated memory, and the conductive gating structures may be incorporated into wordlines of such memory.

Some embodiments include transistors having conductive gating material which includes TiN in combination with one or more highly-conductive metal-containing materials. Some embodiments include integrated assemblies (e.g., integrated memory) comprising such transistors.

Example embodiments are described with reference to FIGS. 1-10.

Figure 1:
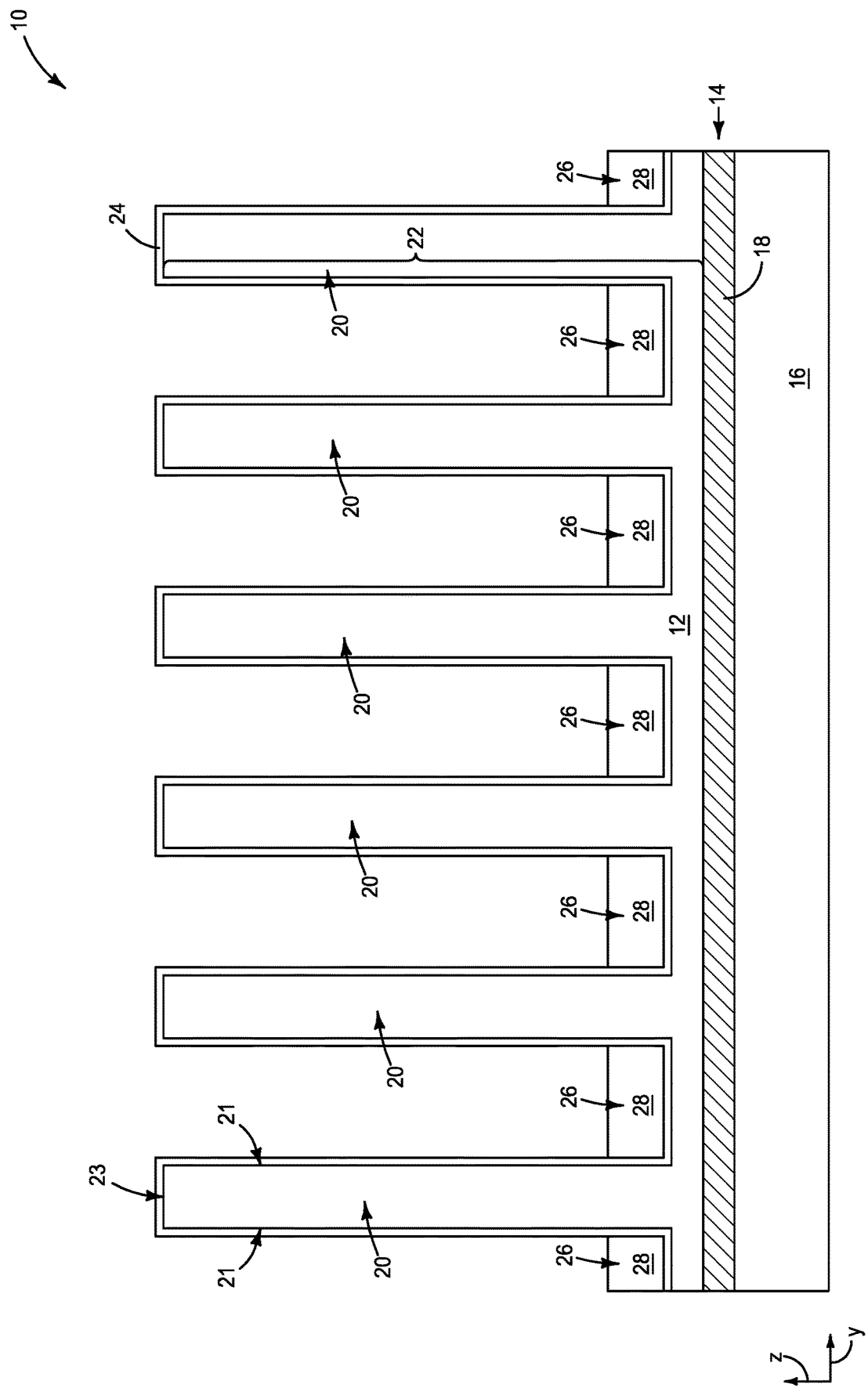
FIGS. 1-5 are diagrammatic cross-sectional side views of a region of an example integrated assembly at example sequential process stages of an example method.

Referring to FIG. 1, a construction (integrated assembly, integrated architecture, etc.) 10 is shown at an example process stage of an example method.

The construction 10 includes a linear conductive structure 14 over an insulative material 16. The linear structure may be, for example, a digit line (bitline, sense line, etc.), and may be representative of a large number of digit lines formed at the processing stage of FIG. 1. The linear structure 14 extends in a horizontal first direction (an illustrated y-axis direction). The structure 14 comprises a conductive material 18. The conductive material 18 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The insulative material 16 may comprise any suitable composition(s), such as, for example, one or more of silicon dioxide, silicon nitride, etc.

Semiconductor material 12 is over the linear conductive structure 14, and is patterned into a series of pillars 20. The pillars 20 extend in a vertical direction (an illustrated z-axis direction). Although the pillars 20 are shown to extend orthogonally relative to the horizontal direction of the linear structure 14, in other embodiments the pillars 20 may extend generally vertically without extending precisely orthogonally relative to the horizontal direction of the linear structure 14. For instance, the pillars may extend along a vertical direction which is within ±10° of being precisely orthogonal relative to the horizontal direction of the linear structure 14.

The semiconductor material 12 may comprise any suitable composition(s), and in some embodiments may comprise, consist essentially of, or consist of one or more of silicon, germanium, III/V semiconductor material (e.g., gallium phosphide), semiconductor oxide (e.g., material comprising indium, gallium, zinc and oxygen), etc. It is to be understood that the term III/V semiconductor material refers to semiconductor materials comprising elements selected from groups III and V of the periodic table (with groups III and V being old nomenclature, and now being referred to as groups 13 and 15).

The pillars 20 may include active regions 22 (only one of which is labeled). Such active regions may include a channel region vertically sandwiched between a conductively-doped upper source/drain region and a conductively-doped lower source/drain region in some embodiments (e.g., in embodiments in which the semiconductor material 12 comprises silicon), or may comprise any other suitable configurations. Lower portions of the active regions are electrically coupled with the linear structure 14.

Insulative material 24 is formed to extend along the semiconductor material 12. In the shown embodiment, the insulative material 24 extends along sidewalls 21 of the pillars 20 and along upper surfaces 23 of the pillars.

The insulative material 24 may correspond to gate dielectric material, and may comprise any suitable composition(s). For instance, the insulative material 24 may comprise, consist essentially of, or consist of one or more of silicon dioxide, hafnium oxide, zirconium oxide, tantalum oxide, aluminum oxide, etc.

Insulative steps 26 are formed along bottom regions of the pillars 20. The insulative steps may be utilized to calibrate the height of bottom surfaces of transistor gates in the processing that follows. The insulative steps comprise insulative material 28. The insulative material 28 may or may not comprise a same composition as the gate dielectric material 24. In some example embodiments, the insulative material 28 and the gate dielectric material 24 may both comprise, consist essentially of, or consist of silicon dioxide.

Figure 2:
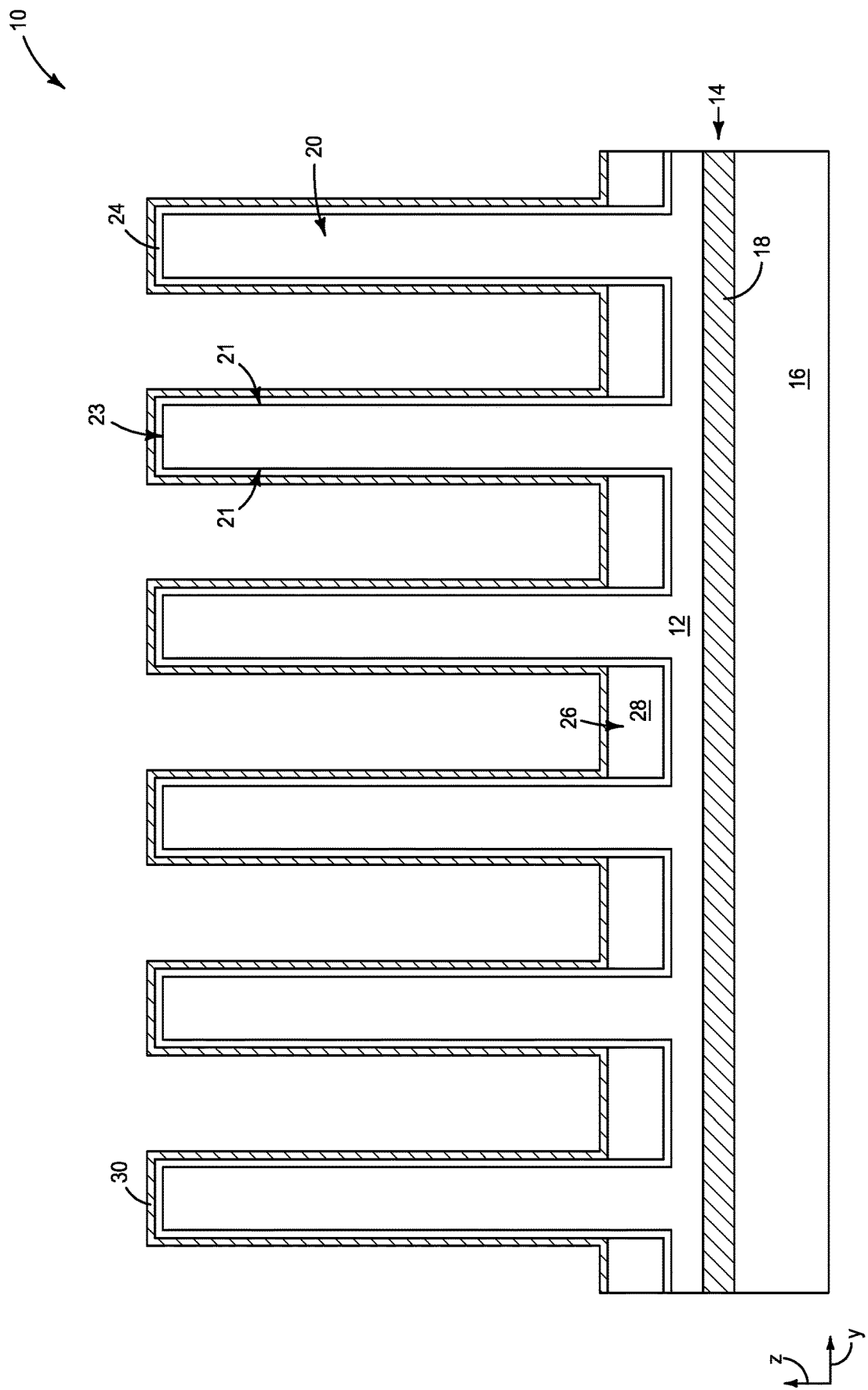

Referring to FIG. 2, a layer of template material 30 is deposited to extend across the steps 26, along the sidewalls 21 of the pillars, and over the tops 23 of the pillars. The template material 30 may comprise, consist essentially of, or consist of titanium and nitrogen, and may be referred to as titanium nitride. In some embodiments, the template material may be referred to as comprising TiN, where the chemical formula indicates primary constituents rather than a specific stoichiometry. In the illustrated embodiment, the template material 30 is deposited over and directly against the insulative material (gate dielectric material) 24.

An advantage of utilizing titanium nitride for the template material 30 is that such may be readily deposited and patterned. A disadvantage of titanium nitride in highly-integrated circuitry is that the conductivity of titanium nitride may be too low to be suitable for applications in which the titanium nitride is very thin (e.g., less than or equal to about 15 nanometers (nm), and in some applications less than or equal to about 10 nm). Accordingly, embodiments described herein may take advantage of the patternability of titanium nitride by utilizing the titanium nitride as a template for selective deposition of more highly-conductive materials.

Figure 3:
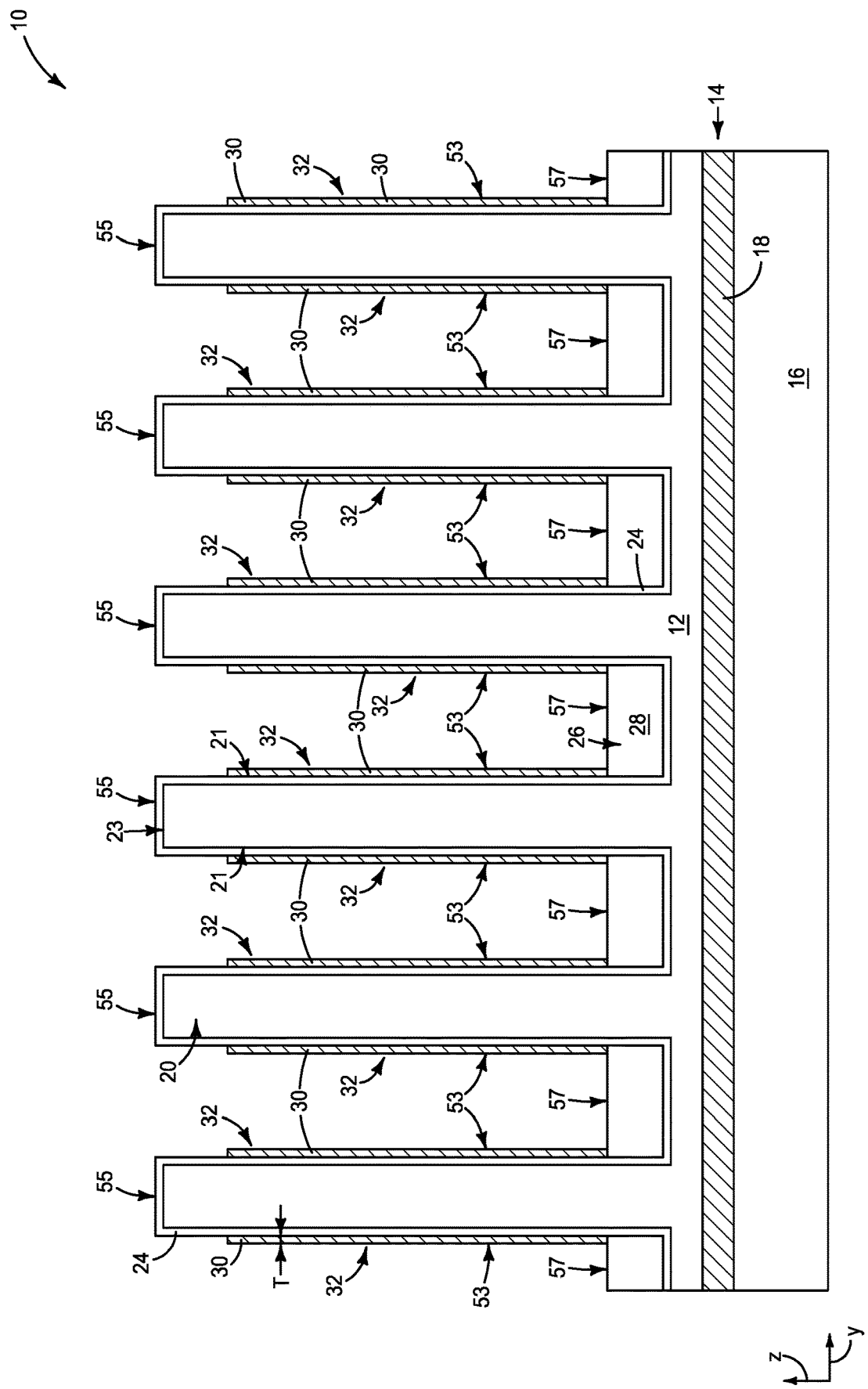

Referring to FIG. 3, the template material 30 is etched utilizing, for example, dry-etching conditions. Such removes the template material from over the tops 23 of the pillars 20 and from over the steps 26, while leaving portions of the template material 30 along the sidewalls 21 of the pillars 20.

In the shown embodiment, the spacers 26 block the template material 30 from being along bottom regions of the pillars 20, and the etching recesses the template material from upper regions of the pillars, and accordingly the remaining template material 30 is only along central segments of the pillars 20 rather than being along the entire vertical lengths of the pillars.

The etching of the template material 30 patterns the material into template structures 32. The template structures are directly adjacent to the insulative material (gate dielectric material) 24 in the shown embodiment. The template structures 32 may extend in and out of the page relative to the cross-sectional view of FIG. 3 (i.e., may extend along a horizontal x-axis direction (not shown in FIG. 3) which is orthogonal to the illustrated horizontal y-axis direction). The template structures may be considered to be templates for second linear structures which extend along a second direction that intersects the first direction of the first linear structure 14. Such second direction may be orthogonal to the first direction (i.e., the second direction may be along an x-axis direction which is orthogonal to the illustrated y-axis direction of the linear structure 14), or not.

The template structures 32 may be formed to be very thin, and in some embodiments may have a lateral thickness T of less than or equal to about 2 nm.

Figure 4:
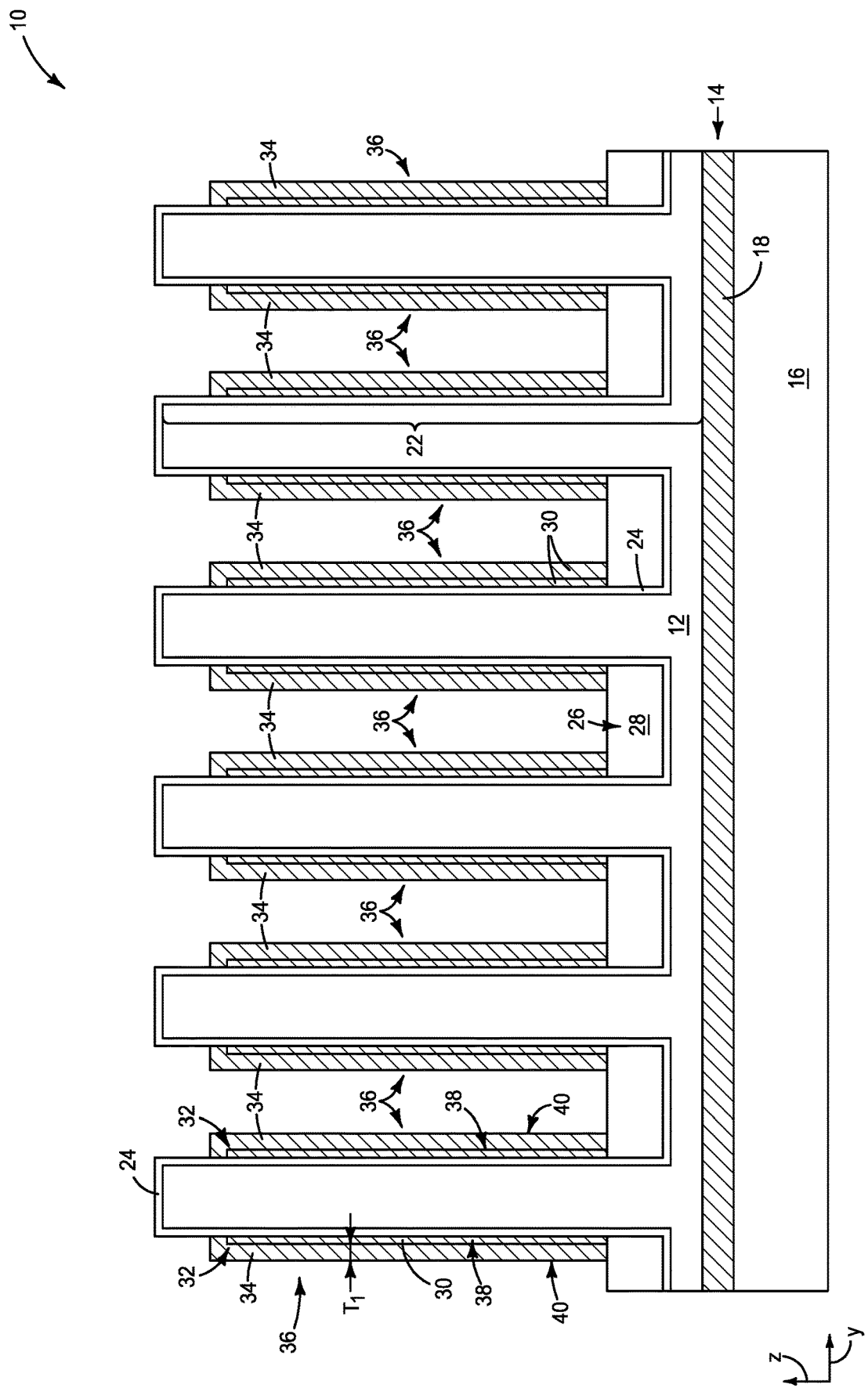

Referring to FIG. 4, conductive metal-containing material 34 is selectively formed on the template material 30 relative to the insulative materials 28 and 24. The materials 30 and 34 may be referred to as first and second conductive materials, respectively. The conductive material 34 is compositionally different from the template material 30. It may be desirable for the conductive material 34 to have a higher conductivity than the template material 30. Such enables the conductive material 34 to be utilized in highly-integrated applications, in that the conductive material 34 may be sufficiently conductive even if the conductive material 34 is formed to be very thin (e.g., less than or equal to about 15 nm, less than or equal to about 12 nm, less than or equal to about 10 nm, etc.). In some embodiments, the conductive material 34 may have a lateral thickness $T_1$ of less than or equal to about 50 nm, less than or equal to about 12 nm, less than or equal to about 10 nm, less than or equal to about 5 nm, etc.; and may, for example, have a lateral thickness $T_1$ within a range of from about 2 nm to about 15 nm.

In some embodiments, the conductive material 34 may also be more resistant to oxidation than the template material 30 and/or may have higher conductivity than the template material 30 in the event that the conductive material 34 should become oxidized.

The conductive material 34 and the template material 30 may be together considered to form conductive gating structures 36. Such gating structures include inner regions 38 corresponding to the template structures 32, and include outer regions 40 corresponding to the conductive material 34. The inner regions 38 may be considered to be relatively proximal the active regions 22 of the pillars 20, and the outer regions 40 may be considered to be relatively distal from such active regions. The gating structures may be considered to be second linear structures which extend along a second direction that intersects the first direction of the first linear structure 14 (with such second direction being in and out of the page relative to the cross-sectional view of FIG. 4).

The metal-containing material 34 may include one or more of Ru, Mo, Cu, Pt, Pd, W, Ta, Co, Rh and Ni; and in some embodiments may include one or more metal nitrides (e.g., TaN, where the chemical formula indicates primary constituents rather than a specific stoichiometry), one or more metal oxides (e.g., RuO, where the chemical formula indicates primary constituents rather than a specific stoichiometry), etc.

The conductive material 34 may be selectively formed on the template material 30 with any suitable methodology. In some embodiments, the conductive material 34 may be selectively formed on the template material 30 utilizing atomic layer deposition (ALD). The conductive material 34 is a metal-containing material (e.g., comprises a metal), and the ALD may utilize a precursor which comprises the metal of the conductive material 34 in combination with one or more of carbon, nitrogen, halogen and oxygen. For instance, the precursor may be a metal organic. In specific applications, the metal of the metal-containing material 34 may be ruthenium, and the precursor may be bis(ethylcyclopentadienyl) ruthenium. As another example, the precursor may be a metal halide which comprises the metal of the metal-containing material 34 in combination with one or more of chlorine, fluorine and bromine.

The gating structures 36 may be considered to be operatively proximate the active regions 22 of the pillars 20 such that a sufficient voltage applied to the gating structures will induce an electric field which enables current to flow vertically through the shown vertically-extending active regions. If the voltage to the gating structures is below a threshold level, the current will not flow through the active regions. In some embodiments, the gating structures 36 may correspond to wordlines which extend in and out of the page relative to the cross-sectional view of FIG. 4, and the selective control of the current flow through the active regions may be achieved by turning selected wordlines ON or OFF.

Figure 5:
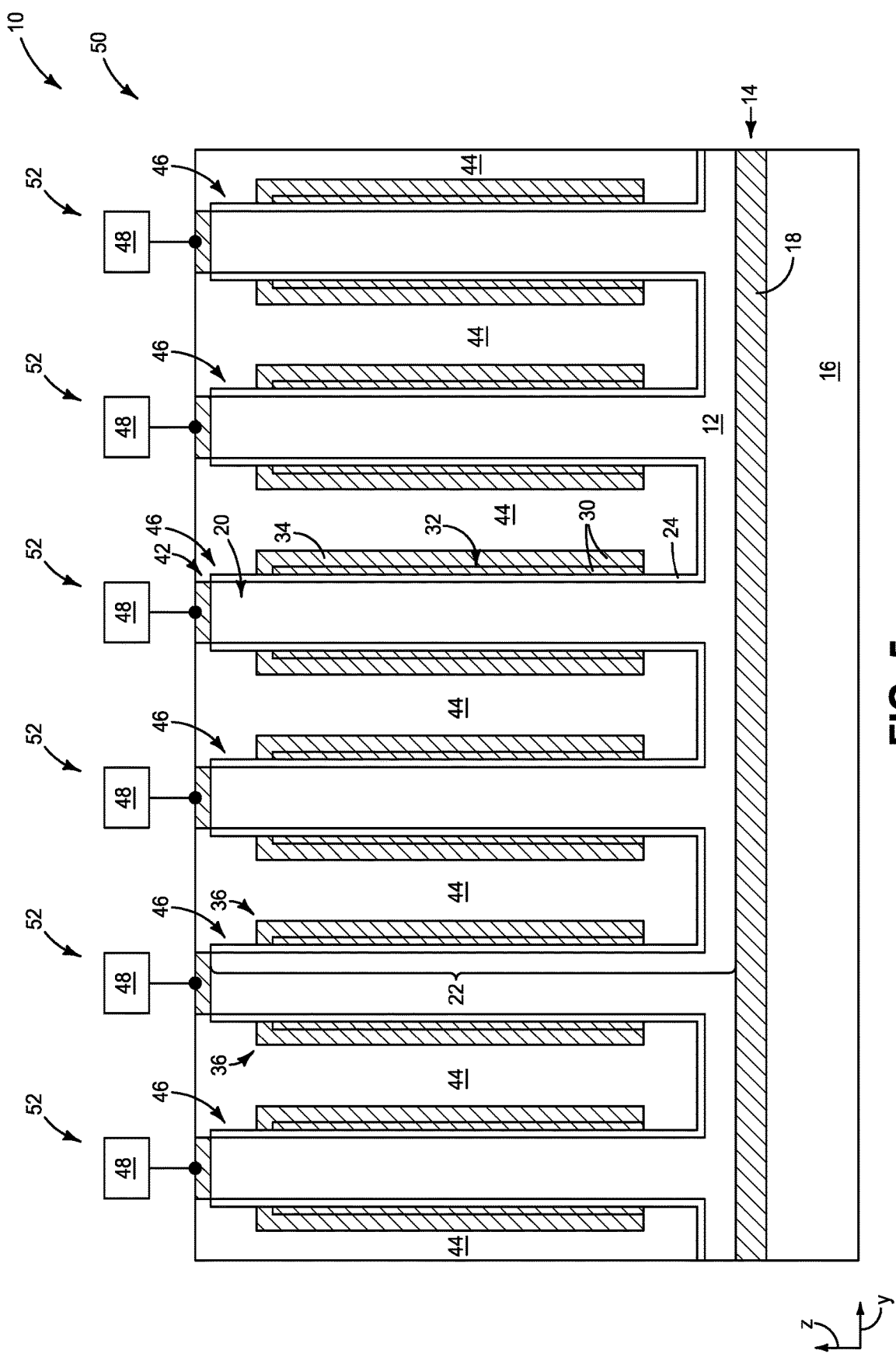

Referring to FIG. 5, the insulative material 24 is removed from over upper surfaces of the pillars 20, and conductive caps 42 are formed directly against the semiconductor material 12 of the pillars 20. The conductive caps 42 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Insulative material 44 is formed between the pillars 20. The insulative material 44 may comprise any suitable composition(s), and in some embodiments may comprise, consist essentially of, or consist of one or more of silicon dioxide, silicon nitride, etc.

The active regions 22 and gating structures 36 together form integrated transistors 46. Such transistors may be access devices within a memory array 50, and may be coupled with storage elements 48. The storage elements may be any suitable devices having at least two detectable states; and in some embodiments may be, for example, capacitors, resistive-memory devices, conductive-bridging devices, phase-change-memory (PCM) devices, programmable metallization cells (PMCs), etc. If the storage elements are capacitors, such capacitors may be ferroelectric capacitors or non-ferroelectric capacitors.

The access devices 46 and storage elements 48 together form memory cells 52 of the memory array 50. The illustrated memory cells 52 may be representative of a large number of memory cells formed within the memory array 50. For instance, in some embodiments the memory array may have thousands, hundreds of thousands, millions, hundreds of millions, etc., of memory cells.

In the shown embodiment, the steps 26 (FIG. 4) are removed from the memory array 50. In other embodiments, the steps 26 may remain within the memory array.

The configuration of FIG. 5 may be considered to correspond to a region of an integrated assembly comprising a memory array. In other embodiments, analogous integrated assemblies may be formed with other processing. An example of such other embodiments is described with reference to FIGS. 6-9.

Figure 6:
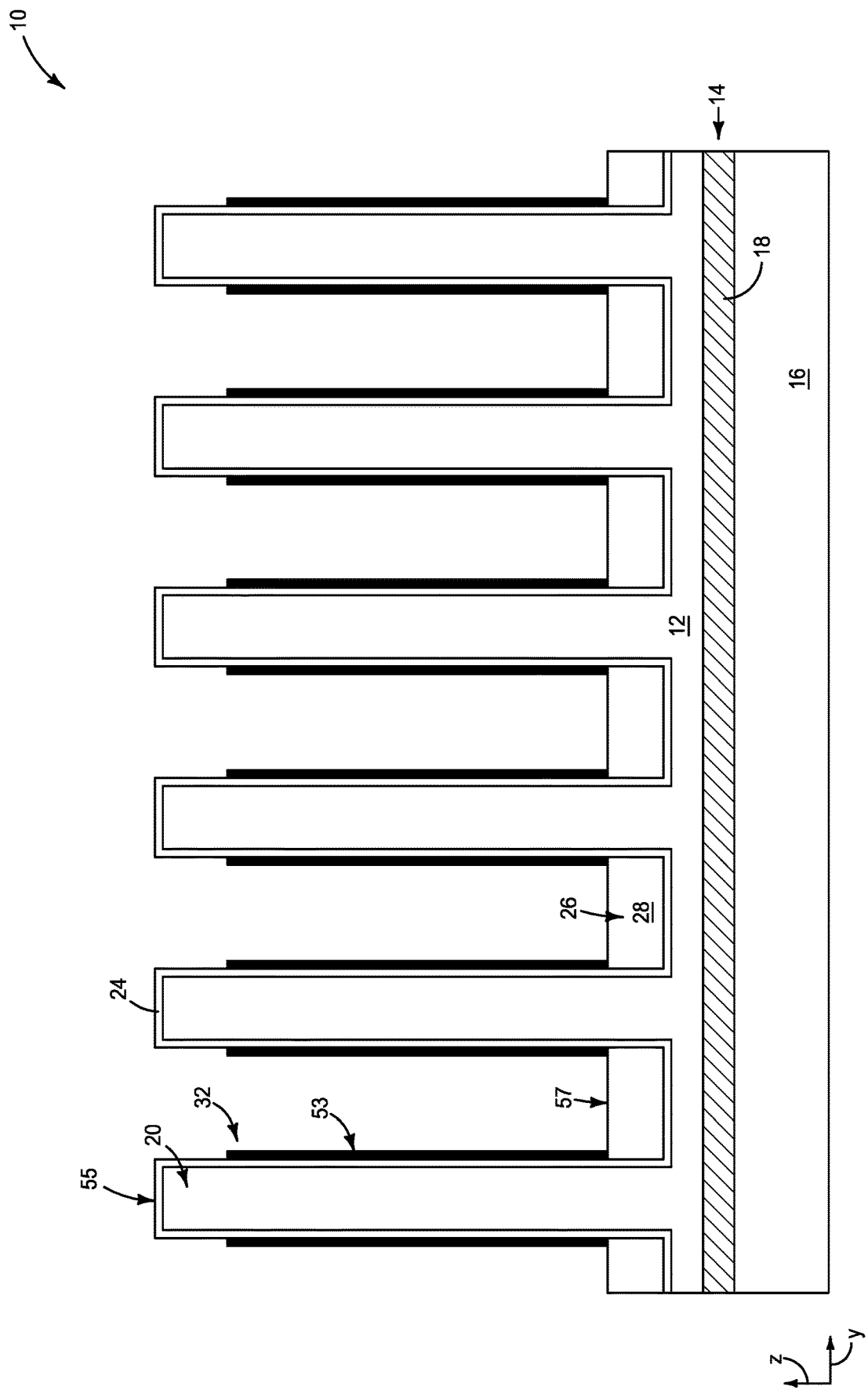
FIGS. 6-9 are diagrammatic cross-sectional side views of a region of an example integrated assembly at example sequential process stages of another example method. The process stage of FIG. 6 may follow that of FIG. 3.

FIG. 6 shows the assembly 10 at a process stage which may follow that of FIG. 3. Referring back to FIG. 3, the illustrated configuration may be considered to have first exposed surfaces 53 corresponding to surfaces of the template structures 32, second exposed surfaces 55 corresponding to surfaces of the insulative material 24, and third exposed surfaces 57 corresponding to surfaces of the insulative material 28 of the steps 26. In some embodiments, the insulative materials 24 and 28 may comprise a same composition as one another (e.g., may both comprise, consist essentially of, or consist of silicon dioxide), and accordingly the second and third surfaces 55 and 57 may comprise a same composition as one another.

The first exposed surfaces 53 (e.g., the surfaces of the template structures 32) are modified. Such modification is diagrammatically illustrated by showing changes throughout the entirety of the structures 32 as indicated by a change in shading of the structures (e.g., a change from the crosshatching of FIG. 3 to the solid dark color of FIG. 6). The modification of the surfaces 53 may be primarily along the surfaces of the structures 32, or may extend throughout the structures 32.

In some embodiments, the modification of the surfaces 53 may be accomplished by exposure of the construction 10 to reductant. The reductant may, for example, include forming gas (i.e., a mixture of $H_2$ and $N_2$). The modified surfaces 53 of the template structures 32 may promote formation of conductive material along the surfaces 53 at a subsequent process stage (described below with reference to FIG. 8).

Figure 7:
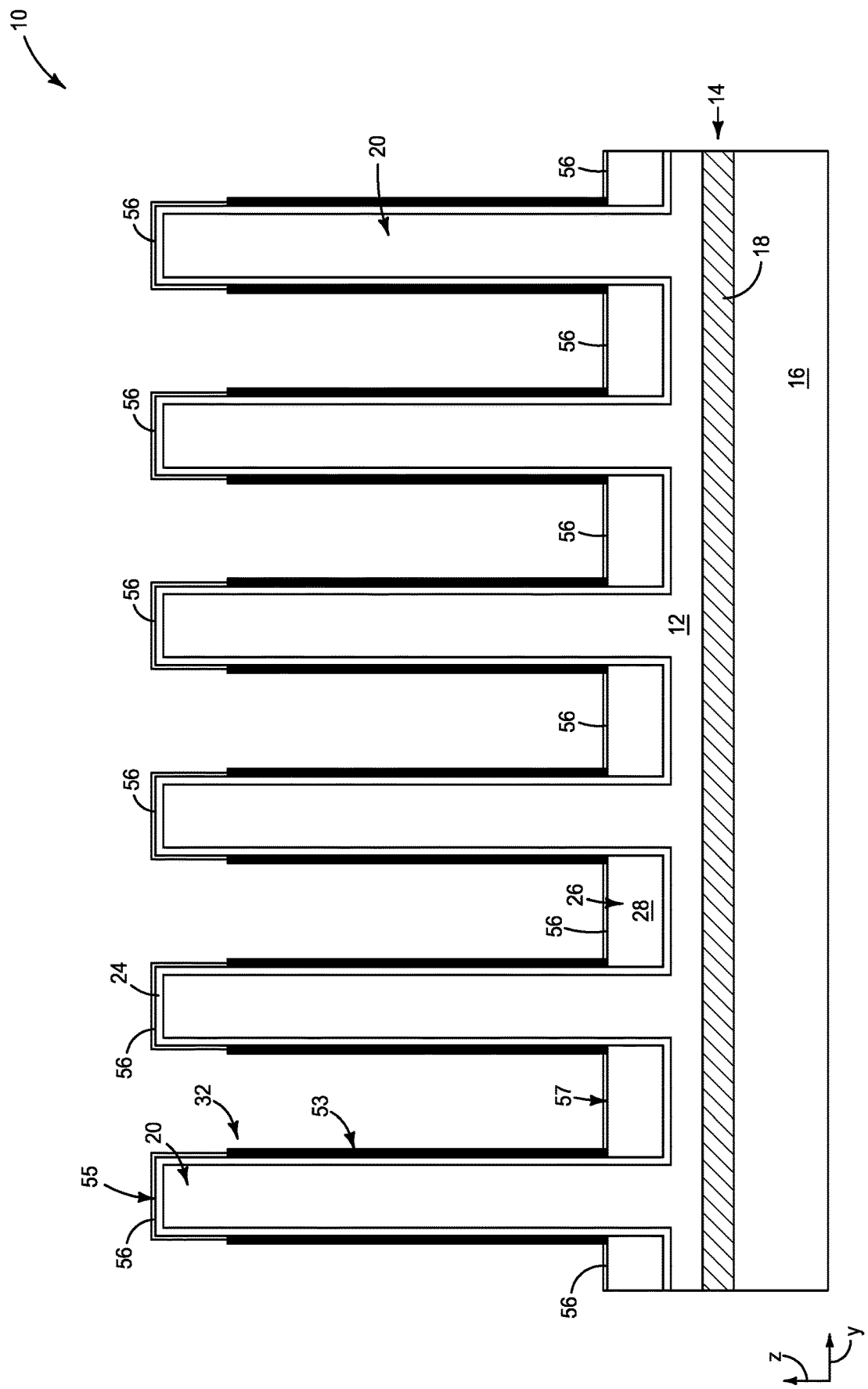

Referring to FIG. 7, the second and third exposed surfaces 55 and 57 are modified, with such modification being diagrammatically illustrated by formation of a material 56 over the surfaces 55 and 57. The modification of the surfaces 55 and 57 may comprise exposure of silicon dioxide of such surfaces to a silane (e.g., dimethylaminotrimethylsilane). Such modification may inhibit formation of conductive material along the surfaces 55 and 57 at a subsequent process stage (described below with reference to FIG. 8).

Figure 8:
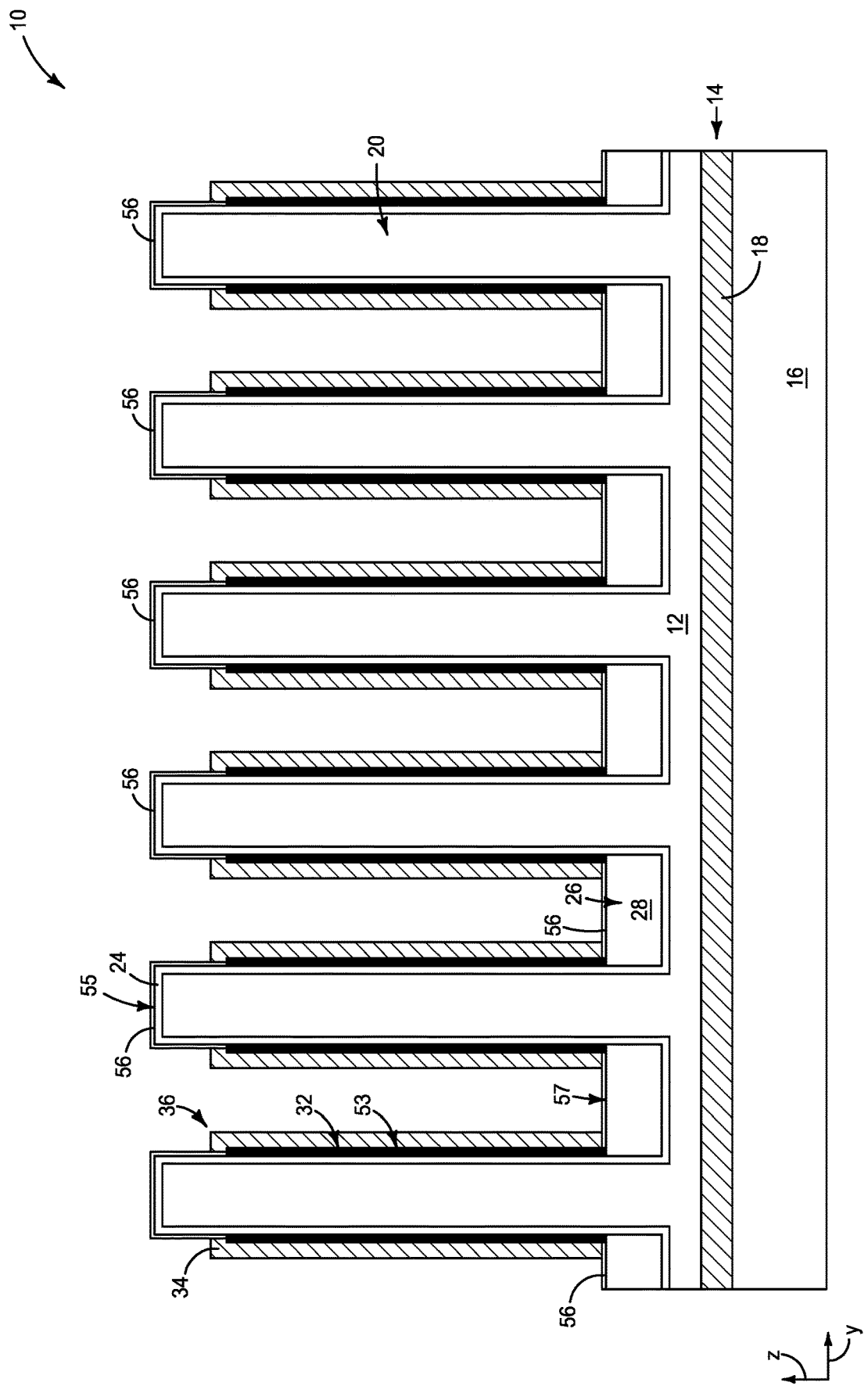

Referring to FIG. 8, such shows the conductive metal-containing material 34 selectively deposited along the modified surfaces 53 relative to the modified surfaces 55 and 57. In some embodiments, the deposition of the conductive material 34 may utilize one or both of atomic layer deposition and chemical vapor deposition, and may utilize a precursor which comprises the metal of the conductive material 34 in combination with one or more of carbon, nitrogen, halogen and oxygen. Such precursor may be, for example, a metal organic, and in some embodiments may comprise one or more carbonyl moieties. For instance, in some example embodiments the metal of the conductive material 34 may be ruthenium, and the precursor utilized to form the conductive material 34 at the process stage of FIG. 8 may comprise the ruthenium in combination with one or more carbonyl moieties.

Although the embodiment of FIGS. 6-8 shows both the treatment of surfaces of the template structures 32 with a process to promote formation of the conductive material 34 along the surfaces of such template structures, and the treatment of the surfaces of the insulative materials 24 and 28 with a process to inhibit formation of the conductive material 34 along the surfaces of such insulative materials, it is to be understood that in other embodiments only one of the treatments may be utilized. In other words, the processing of FIGS. 6 and 7 (i.e., the modification of the surfaces of the template structures 32 (FIG. 6) and the modification of the surfaces of the insulative materials 24 and 28 (FIG. 7)) may be utilized together, or may be utilized alternatively relative to one another. In any event, the conductive material 34 is selectively formed on the template structures 32 rather than on the insulative materials 24 and 28.

The conductive material 34 and template structures 32 together form gating structures 36 analogous to those described above with reference to FIG. 4.

Figure 9:
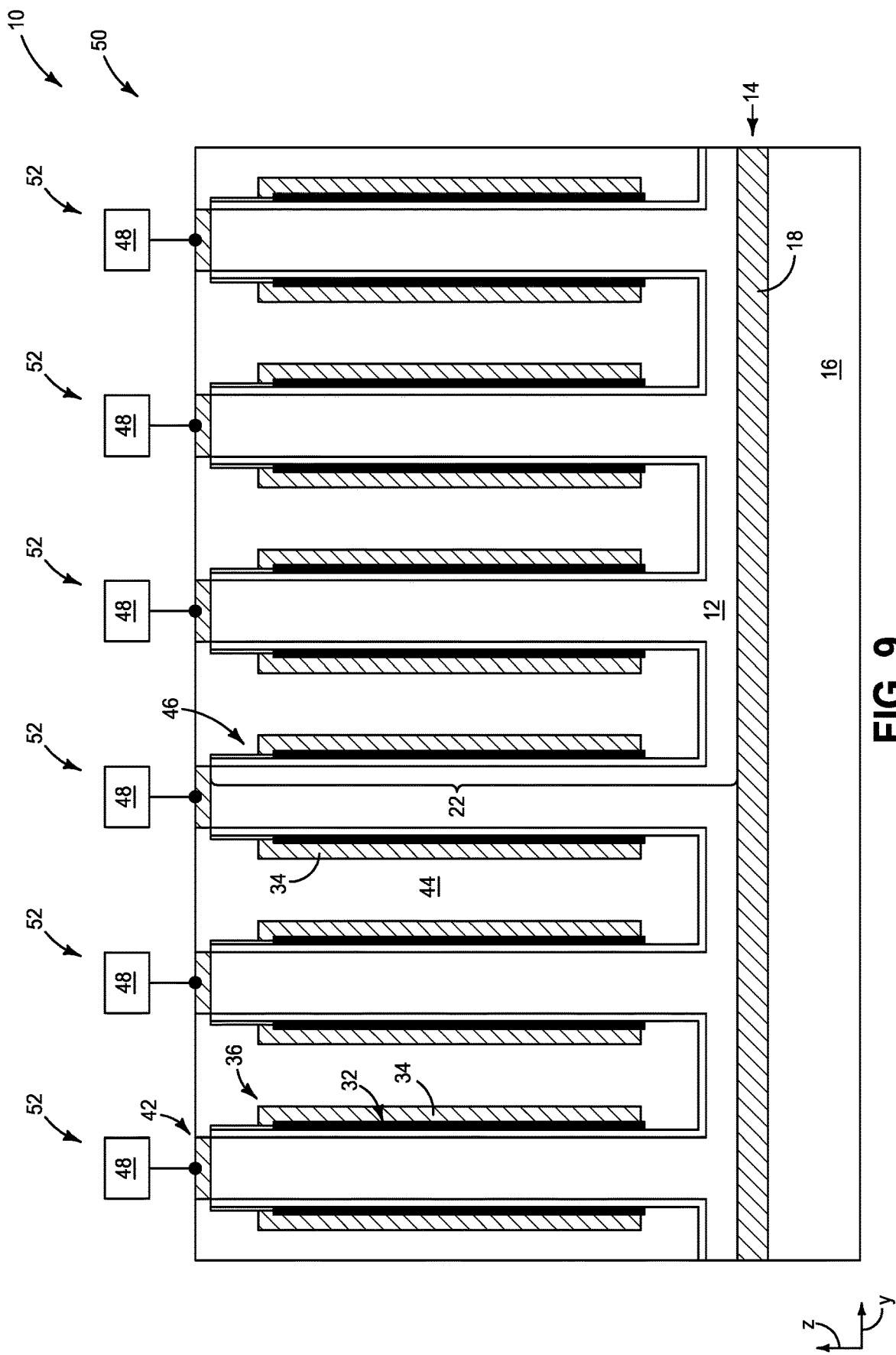

Referring to FIG. 9, the construction 10 is subjected to processing analogous to that described above with reference to FIG. 5 to form the memory array 50 comprising the memory cells 52.

Figure 10:
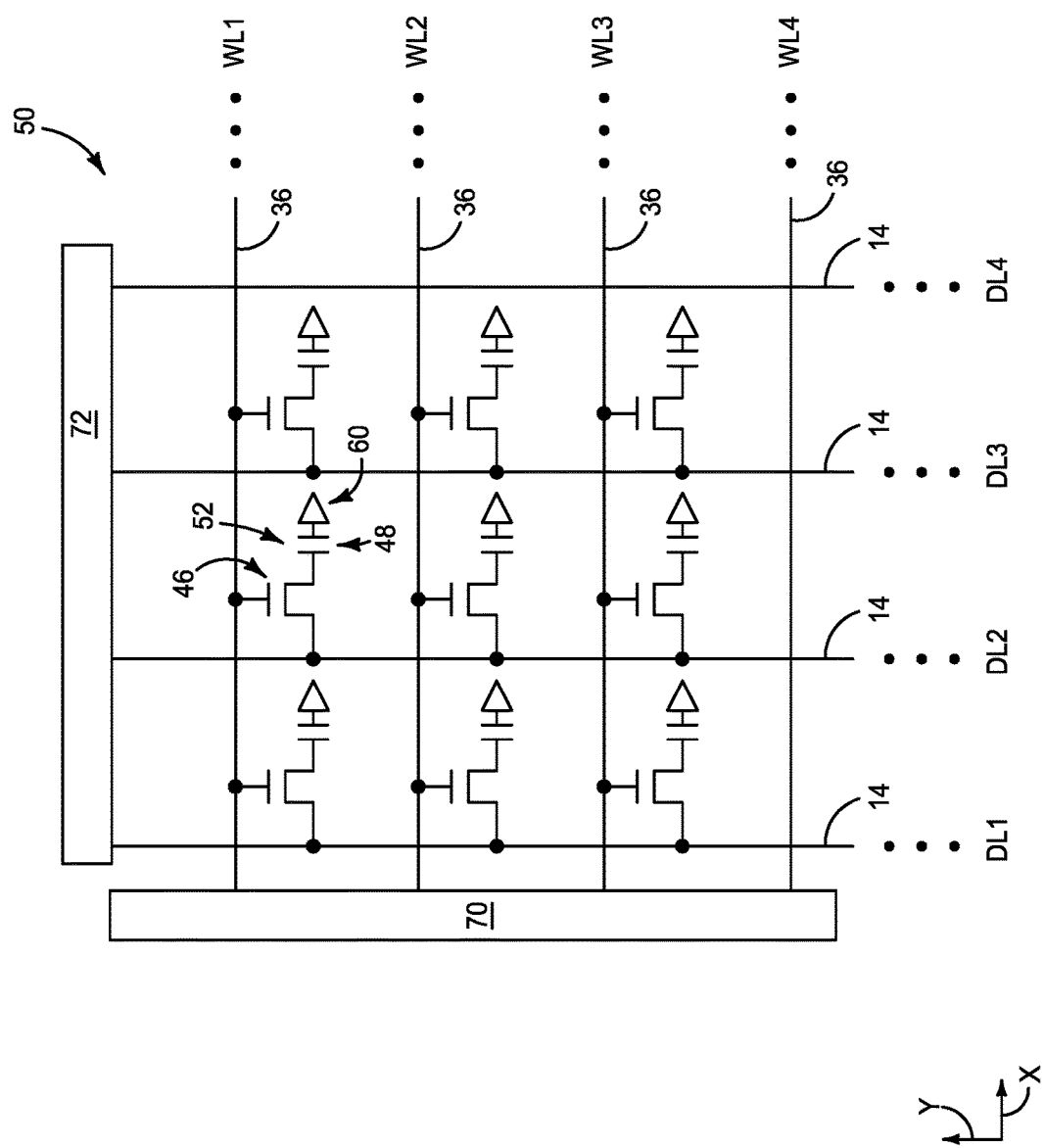
FIG. 10 is a diagrammatic schematic view of a region of an example memory array.

The memory arrays 50 of FIGS. 5 and 9 may have any suitable configuration(s). FIG. 10 shows an example configuration in which the storage elements 48 are capacitors. The capacitors may be non-ferroelectric capacitors, and accordingly the memory array 50 may be a dynamic random access memory (DRAM) array. Alternatively, the capacitors may be ferroelectric capacitors, and accordingly the memory array 50 may be a ferroelectric random access memory (FeRAM) array.

The illustrated capacitors 48 have an electrical node coupled with an access transistor 46, and have another electrical node coupled with a reference 60. The reference 60 may correspond to any suitable reference voltage, including, ground, VCC/2, etc.

The wordlines 36 are shown extending along an x-axis direction, and are coupled with wordline-driver-circuitry 70. The digit lines 14 are shown extending along a y-axis direction, and are coupled with sense-amplifier-circuitry 72. The access transistors 46 and storage elements 48 together form the memory cells 52, with each of the memory cells being uniquely addressed by one of the digit lines 14 in combination with one of the wordlines 36.

In some embodiments, the relatively simple patterning of the highly-conductive thin linear structures (wordlines) 36 accomplished utilizing the processes described herein may be achieved with lower costs than comparable patterning accomplished utilizing conventional processes.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated transistor having an active region comprising semiconductor material. A conductive gating structure is operatively proximate the active region. The conductive gating structure includes an inner region proximal the active region and includes an outer region distal from the active region. The inner region includes a first material which contains titanium and nitrogen, and the outer region includes a metal-containing second material. The second material has a higher conductivity than the first material.

Some embodiments include a method of forming an integrated assembly. A construction is formed to include first linear structures, and to include pillars of semiconductor material over the first linear structures. The first linear structures extend along a first direction. Each of the pillars includes an active region. Lower portions of the active regions are coupled with the first linear structures. Insulative material is formed along sidewalls of the pillars. Template structures are formed adjacent the insulative material. The template structures comprise template material and are patterned to extend along only central segments of the pillars rather than along entire vertical lengths of the pillars. The template structures are configured as second linear structures which extend along a second direction that intersects the first direction. Conductive material is selectively formed on the template material relative to any other exposed materials of the construction. The conductive material is more conductive than the template material. Storage elements are formed to be coupled with upper portions of the active regions.

Some embodiments include a method of forming an integrated assembly. A construction is formed to include first linear structures and to include pillars of semiconductor material over the first linear structures. The first linear structures extend along a first direction. Each of the pillars includes an active region. Lower portions of the active regions are coupled with the first linear structures. The pillars have top surfaces and have sidewall surfaces extending downwardly from the top surfaces. Insulative material is formed along the sidewall surfaces and along the top surfaces. Template structures are formed adjacent the insulative material. The template structures are patterned to extend along only central segments of the pillars rather than along an entire vertical length of the pillars. The template structures are configured as second linear structures which extend along a second direction. The second direction intersects the first direction. After the template structures are formed, the construction has first exposed surfaces corresponding to surfaces of the template structures and has second exposed surfaces corresponding to surfaces of the insulative material. The second exposed surfaces are modified to inhibit formation of a conductive material along the second exposed surfaces and/or the first exposed surfaces are modified to promote formation of the conductive material along the first exposed surfaces. After said modification of the second exposed surfaces and/or said modification of the first exposed surfaces, the conductive material is selectively formed along the first exposed surfaces relative to the second exposed surfaces. Storage elements a formed to be coupled with upper portions of the active regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated transistor, comprising:
   an active region pillar over a base, the active region pillar comprising semiconductor material having opposing sidewalls;
   an insulative material against an entirety of the opposing sidewalls of the active region pillar and extending over the base adjacent the active region pillar;
   an insulative step along the insulative material proximate a bottom portion of the active region pillar; and
   a conductive gating structure operatively proximate the active region and spaced from the base by the insulative material and the insulative step;
   the conductive gating structure including an inner region proximal the active region and including an outer region distal from the active region; the inner region comprising a first material which includes titanium and nitrogen, and the outer region comprising a metal-containing second material; the second material having a higher conductivity than the first material and being present along an entirety of an outer surface and at least a portion of an upper surface of the inner region.

2. The integrated transistor of claim 1 wherein the inner region has a thickness of less than or equal to about 2 nm.

3. The integrated transistor of claim 1 wherein the outer region has a thickness within a range of from about 2 nm to about 15 nm.

4. The integrated transistor of claim 1 wherein the second material includes one or more of Ru, Mo, Cu, Pt, Pd, W, Ta, Co, Rh and Ni.

5. The integrated transistor of claim 1 wherein the second material includes one or more metal nitrides.

6. The integrated transistor of claim 5 wherein the second material includes TaN, where the chemical formula indicates primary constituents rather than a specific stoichiometry.

7. The integrated transistor of claim 1 wherein the second material includes one or more metal oxides.

8. A memory array comprising the integrated transistor of claim 1 as one of many substantially identical access devices, with the access devices being coupled with storage elements.

9. The memory array of claim 8 wherein the storage elements comprise capacitors.

10. The memory array of claim 9 wherein the capacitors are ferroelectric capacitors.

11. The memory array of claim 9 wherein the capacitors are non-ferroelectric capacitors.

* * * * *